(12) United States Patent
Tsukahara

(10) Patent No.: US 9,565,764 B2
(45) Date of Patent: Feb. 7, 2017

(54) INDUCTOR AND MMIC

(71) Applicant: Mitsubishi Electric Corporation, Tokyo (JP)

(72) Inventor: Yoshihiro Tsukahara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 255 days.

(21) Appl. No.: 14/481,259

(22) Filed: Sep. 9, 2014

(65) Prior Publication Data

US 2015/0170827 A1 Jun. 18, 2015

(30) Foreign Application Priority Data

Dec. 17, 2013 (JP) ................... 2013-260583

(51) Int. Cl.
*H01F 27/28* (2006.01)
*H05K 1/16* (2006.01)
(Continued)

(52) U.S. Cl.
CPC .......... *H05K 1/162* (2013.01); *H01F 17/0013* (2013.01); *H01F 27/29* (2013.01);
(Continued)

(58) Field of Classification Search
CPC .......... H01F 27/28; H01F 27/32; H01F 27/29; H01F 27/2828; H01F 27/2823; H01F 27/327; H05K 1/16; H05K 1/162
(Continued)

(56) References Cited

U.S. PATENT DOCUMENTS 4,683,443 A 7/1987 Young et al.
5,610,433 A 3/1997 Merrill et al.
(Continued)

FOREIGN PATENT DOCUMENTS

DE 10 2009 046 183 A1 5/2010
JP 2000-269418 A 9/2000
(Continued)

OTHER PUBLICATIONS

State Intellectual Property Office of the People's Republic of China, Office Action in Chinese-Patent Application No. 201410790122.5 (May 30, 2016).
(Continued)

*Primary Examiner* — Eric Thomas
*Assistant Examiner* — Michael P McFadden
(74) *Attorney, Agent, or Firm* — Leydig, Voit & Mayer

(57) ABSTRACT

An inductor includes a first coil, an input terminal electrically connected to an outermost portion of the first coil, a first insulating film on the first coil, a second coil on the first insulating film, a second insulating film on the second coil, a third coil on the second insulating film, connection conductors that connect the first coil to the second coil at locations so that a signal propagates through outside portions of the first coil and the second coil before propagating through other portions of the first coil and the second coil, a central portion connection conductor that connects a central portion of the first coil or a central portion of the second coil to a central portion of the third coil, and an output terminal electrically connected to an outermost portion of the third coil.

14 Claims, 10 Drawing Sheets

(51) Int. Cl.
*H01F 27/29* (2006.01)
*H01F 17/00* (2006.01)

(52) U.S. Cl.
CPC ............... *H01F 2017/004* (2013.01); *H01F 2017/0086* (2013.01); *H05K 1/165* (2013.01)

(58) Field of Classification Search
USPC ........................................... 361/763
See application file for complete search history.

(56) References Cited

U.S. PATENT DOCUMENTS

| | | | |
|---|---|---|---|
| 8,446,243 B2 | 5/2013 | Strzalkowski et al. | |
| 2003/0127704 A1* | 7/2003 | Kobayashi | H01F 17/0006 257/531 |
| 2009/0027152 A1 | 1/2009 | Gianesello | |
| 2009/0315662 A1* | 12/2009 | Hijioka et al. | H01F 17/0013 336/200 |
| 2010/0109123 A1 | 5/2010 | Strzalkowski et al. | |

FOREIGN PATENT DOCUMENTS

| | | |
|---|---|---|
| JP | 2003-78017 A | 3/2003 |
| JP | 2003-243570 A | 8/2003 |
| JP | 2013-153011 A | 8/2013 |
| WO | WO 2008/016089 A1 | 2/2008 |

OTHER PUBLICATIONS

German Patent Office; Office Action in German Patent Application No. 10 2014 225 049.8 (Apr. 26, 2016).

\* cited by examiner

INDUCTOR AND MMIC

BACKGROUND OF THE INVENTION

Field of the Invention

The present invention relates to an inductor and an MMIC (Monolithic Microwave Integrated Circuit) used for a high-frequency device employed in a high-frequency radio device or high-frequency radar device or the like.

Background Art

Japanese Patent Application Laid-Open No. 2000-269418 discloses a spiral inductor with three layers of coil layered on one another. The coils of the first layer, second layer and third layer are formed in a spiral shape respectively. An air bridge is formed on the coil of the third layer to connect a central portion of the coil of the third layer and an outside of the inductor.

Coils may be formed in three layers to construct an inductor. An input terminal is connected to the coil of the bottom layer of the inductor and an output terminal is connected to the coil of the top layer of the inductor. When the coils of the three layers are formed in a spiral shape, a signal flows from an outside portion to an inside portion of the coil of the bottom layer, then flows from an inside portion to an outside portion of the coil of the intermediate layer and finally flows from an outside portion to an inside portion of the coil of the top layer. Therefore, connecting the coil of the top layer and the output terminal involves a problem that a complicated configuration such as the air bridge disclosed in Japanese Patent Application Laid-Open No. 2000-269418 is necessary. This problem exists not only in a case where coils are formed in three layers, but also in an inductor in which coils are formed in three or more odd-numbered layers (e.g., five layers).

SUMMARY OF THE INVENTION

The present invention has been implemented to solve the above-described problems and it is an object of the present invention to provide an inductor and an MMIC using the inductor in a simple configuration to allow a connection with terminals and with coils formed in three or more odd-numbered layers.

The features and advantages of the present invention may be summarized as follows.

According to one aspect of the present invention, an inductor includes a first coil, an input terminal electrically connected to an outermost portion of the first coil, a first insulating film formed on the first coil so as to cover the first coil, a second coil formed on the first insulating film, a second insulating film formed on the second coil so as to cover the second coil, a spiral third coil formed on the second insulating film, a plurality of connection conductors that connect the first coil and the second coil at a plurality of locations so that a signal propagates through outside portions of the first coil and the second coil first, a central portion connection conductor that connects a central portion of the first coil or a central portion of the second coil and a central portion of the third coil, and an output terminal electrically connected to an outermost portion of the third coil.

According to another aspect of the present invention, an inductor includes a spiral first coil, an input terminal electrically connected to an outermost portion of the first coil, a first insulating film formed on the first coil so as to cover the first coil, a second coil formed on the first insulating film, a second insulating film formed on the second coil so as to cover the second coil, a third coil formed on the second insulating film, a central portion connection conductor that connects a central portion of the first coil and a central portion of the second coil or a central portion of the third coil, a plurality of connection conductors that connect the second coil and the third coil at a plurality of locations so that a signal propagates through inside portions of the second coil and the third coil first, and an output terminal electrically connected to an outermost portion of the third coil.

According to another aspect of the present invention, a MMIC includes a substrate, a transistor formed on the substrate, a resistance element formed on the substrate, a capacitor formed on the substrate, and an inductor formed on the substrate includes a first coil, an input terminal electrically connected to an outermost portion of the first coil, a first insulating film formed on the first coil so as to cover the first coil, a second coil formed on the first insulating film, a second insulating film formed on the second coil so as to cover the second coil, a spiral third coil formed on the second insulating film, a central portion connection conductor that connects a central portion of the first coil or a central portion of the second coil and a central portion of the third coil, a plurality of connection conductors that connect the first coil and the second coil at a plurality of locations so that a signal propagates through outside portions of the first coil and the second coil first, and an output terminal electrically connected to an outermost portion of the third coil.

According to another aspect of the present invention, a MMIC includes a substrate, a transistor formed on the substrate, a resistance element formed on the substrate, a capacitor formed on the substrate, and an inductor formed on the substrate includes a spiral first coil, an input terminal electrically connected to an outermost portion of the first coil, a first insulating film formed on the first coil so as to cover the first coil, a second coil formed on the first insulating film, a second insulating film formed on the second coil so as to cover the second coil, a third coil formed on the second insulating film, a central portion connection conductor that connects a central portion of the first coil and a central portion of the second coil or a central portion of the third coil, a plurality of connection conductors that connect the second coil and the third coil at a plurality of locations so that a signal propagates through inside portions of the second coil and the third coil first, and an output terminal electrically connected to an outermost portion of the third coil.

Other and further objects, features and advantages of the invention will appear more fully from the following description.

DETAILED DESCRIPTION OF THE PREFERRED EMBODIMENTS

Figure 1:
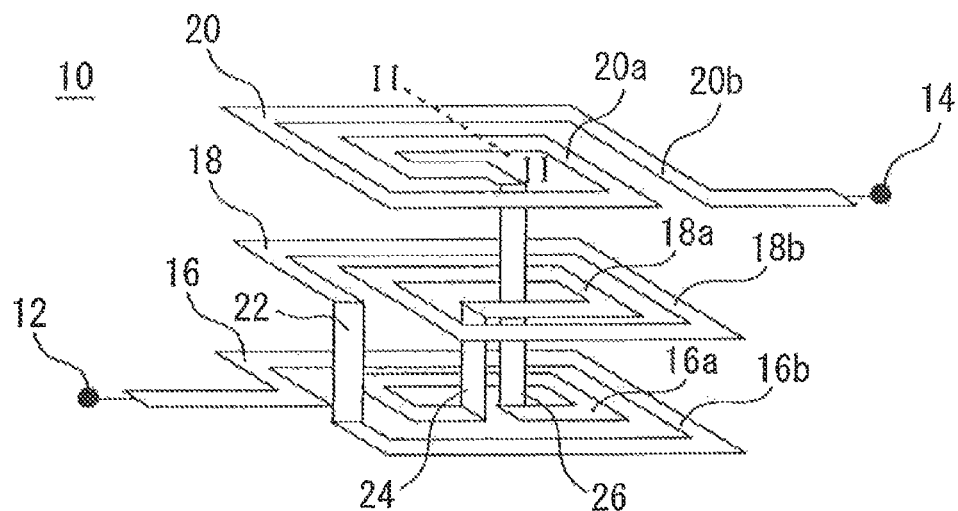
FIG. 1 is a perspective view of an inductor according to a first embodiment of the present invention.

An inductor according to an embodiment of the present invention will be described with reference to the accompanying drawings. Identical or corresponding components will be assigned the same reference numerals and duplicate description may be omitted.

First Embodiment

FIG. 1 is a perspective view of an inductor 10 according to a first embodiment of the present invention. The inductor 10 constitutes a spiral inductor that transmits a signal from an input terminal 12 to an output terminal 14.

The inductor 10 is provided with a concentric first coil 16. The first coil 16 is provided with wirings 16a and 16b. An outermost portion of the first coil 16 and the input terminal 12 are electrically connected. A spiral second coil 18 is formed in a layer above the first coil 16. The second coil 18 is provided with wirings 18a and 18b. A spiral third coil 20 is formed in a layer above the second coil 18. The third coil 20 is provided with wirings 20a and 20b. An outermost portion of the third coil 20 and the output terminal 14 are electrically connected.

The connection between the first coil 16 and the second coil 18 will be described. The first coil 16 and the second coil 18 are connected so that a signal propagates through outside portions first. More specifically, the wiring 16b which is an outside portion of the first coil 16 and the wiring 18b which is an outside portion of the second coil 18 are connected via a connection conductor 22. The wiring 16a which is an inside portion of the first coil 16 and the wiring 18a which is an inside portion of the second coil 18 are connected via a connection conductor 24.

The connection between the third coil 20 and the first coil 16 will be described. A central portion (wiring 16a) of the first coil 16 and a central portion (wiring 20a) of the third coil 20 are connected via a central portion connection conductor 26.

A signal flow of the inductor 10 will be described. A signal inputted from the input terminal 12 first propagates through the wiring 16b and propagates through wiring 18b via the connection conductor 22. That is, the signal propagates through the outside portions of the first coil 16 and the second coil 18. Next, the signal propagates through the wiring 18a and propagates through the wiring 16a via the connection conductor 24. That is, the signal propagates through the inside portions of the first coil 16 and the second coil 18. Then, the signal propagates from the inside portion to the outside portion of the third coil 20 via the central portion connection conductor 26 and is outputted to the output terminal 14.

Figure 2:
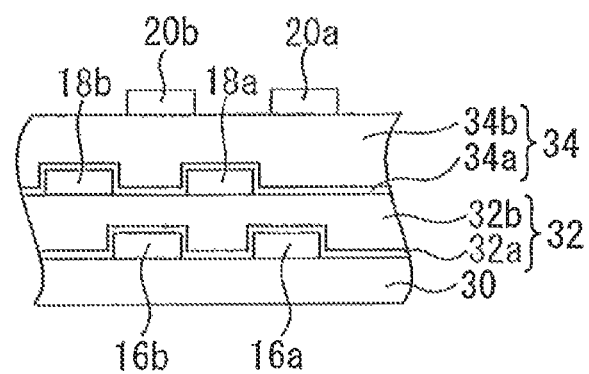
FIG. 2 is a cross-sectional view along a broken line II-II in FIG. 1.

FIG. 2 is a cross-sectional view along a broken line II-II in FIG. 1. FIG. 2 is a diagram illustrating relative positions of the first to third coils, a configuration between the first coil 16 and the second coil 18 and a configuration between the second coil 18 and the third coil 20. The first coil 16 is formed on a semiconductor substrate 30. The material of the semiconductor substrate 30 is not particularly limited but can be, for example, GaAs, Si, SiGe, SiC or GaN. A first insulating film 32 is formed on the first coil 16 so as to cover the first coil 16. The first insulating film 32 is provided with an insulating film 32a for providing the first coil 16 with moisture resistance and a dielectric film 32b. The insulating film 32a is made, for example, of SiN. The dielectric film 32b is made, for example, of polyimide.

The second coil 18 is formed on the first insulating film 32. A second insulating film 34 is formed on the second coil 18 so as to cover the second coil 18. The second insulating film 34 is provided with an insulating film 34a for providing the second coil 18 with moisture resistance and a dielectric film 34b. The insulating film 34a is made, for example, of SiN. The dielectric film 34b is made, for example, of polyimide.

The third coil 20 is formed on the second insulating film 34. As is obvious from FIG. 2, the second coil 18 is formed so as to avoid positions right above the first coil 16. On the other hand, the third coil 20 is formed right above the first coil 16. The aforementioned connection conductors 22 and 24 are formed in contact holes perforated in the first insulating film 32 and the central portion connection conductor 26 is formed in contact holes perforated in the first insulating film 32 and the second insulating film 34.

According to the inductor 10 of the first embodiment of the present invention, the first coil 16 and the second coil 18 are connected through the connection conductors 22 and 24 so that a signal propagates through the outside portions of the first coil 16 and the second coil 18 first. It is thereby possible to connect the central portion (wiring 16a) of the first coil 16 and the central portion (wiring 20a) of the third coil 20 via the central portion connection conductor 26 to allow a signal to propagate from the inside portion to the outside portion of the third coil 20. This allows the input terminal 12 to be connected to the outermost portion of the first coil 16 and allows the output terminal 14 to be connected to the outermost portion of the third coil 20. That is, the inductor 10 and the terminals can be connected in a simple configuration without requiring any complicated configuration such as an air bridge.

The second coil 18 is formed so as to avoid positions right above the first coil 16 and the third coil 20 is formed right above the first coil 16. That is, the first coil 16 and the second coil 18 do not overlap with each other in a plan view, and the second coil 18 and the third coil 20 do not overlap with each other in a plan view. This prevents coupling capacitances between the first coil 16 and the second coil 18 and between the second coil 18 and the third coil 20 from increasing.

Figure 3:
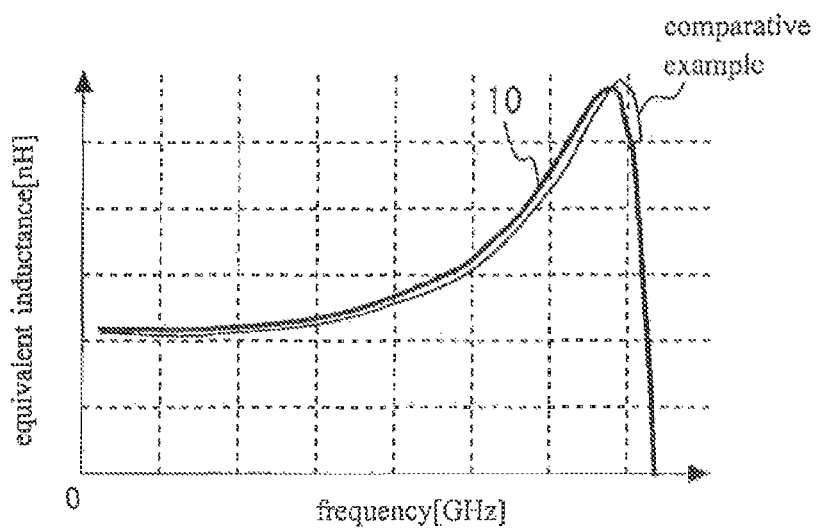
FIG. 3 is a diagram illustrating frequency characteristics of the inductor.

Here, as a comparative example, an inductor will be considered in which coils are formed in two layers, the inductor having the same number of turns as that of the inductor 10. FIG. 3 is a diagram illustrating frequency characteristics of the inductor 10 and the inductor of the comparative example. The cutoff frequency of the inductor 10 and that of the inductor of the comparative example are substantially the same. Thus, the inductor 10 having a new structure has substantially the same frequency characteristic as the inductor of the comparative example having a conventional structure in which coils are formed in two layers.

In the first embodiment of the present invention, although the central portion of the first coil 16 and the central portion of the third coil 20 are connected via the central portion connection conductor 26, the central portion of the second coil 18 and the central portion of the third coil 20 may also be connected via the central portion connection conductor.

The number of conductors that connect the first coil 16 and the second coil 18 is not limited to two. The number of connection conductors is not particularly limited as long as a plurality of connection conductors are provided which connect the first coil 16 and the second coil 18 at a plurality of locations so that a signal propagates through outside portions of the first coil 16 and the second coil 18 first.

In the first embodiment of the present invention, the first coil 16 is formed in a concentric shape and the second coil 18 is formed in a spiral shape. There is no particular limitation as to whether the first coil and the second coil are formed concentrically or spirally as long as a signal propagates through outside portions of the first coil 16 and the second coil 18 first.

An MMIC is an integrated circuit in which a transistor, resistance element, inductor and capacitor are formed on the same substrate. Matching circuits are often formed using passive elements such as a resistance element, inductor and capacitor. In such an MMIC, spiral inductors occupying large areas have inhibited a size reduction of the MMIC, but adopting the inductor 10 according to the first embodiment of the present invention can reduce the size of the MMIC. Thus, the inductor 10 is preferably mounted on the MMIC. These modifications are also applicable to inductors and the MMIC according to the following embodiments.

Second Embodiment

Figure 4:
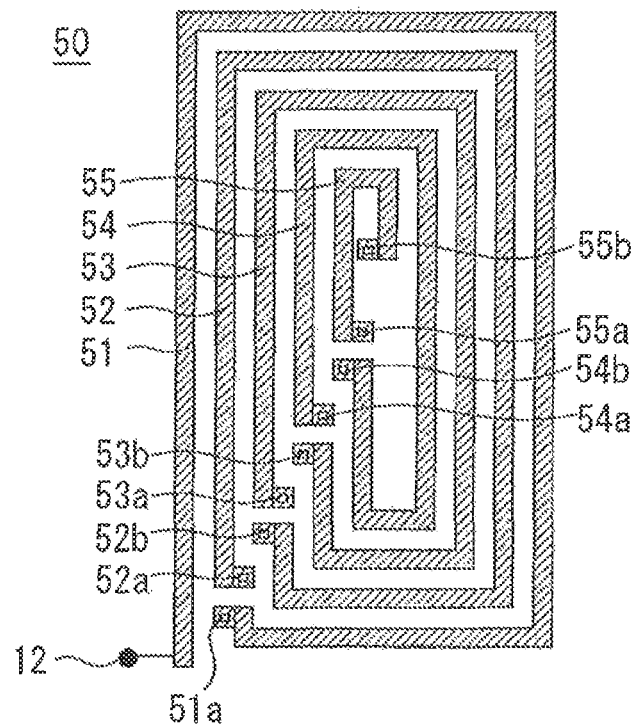
FIG. 4 is a plan view of a first coil of the inductor according to the second embodiment of the present invention.

An inductor according to a second embodiment of the present invention is similar to the inductor 10 of the first embodiment in that a signal propagates through outside portions of the first coil and second coil first, but has more turns of each coil than the inductor 10. FIG. 4 is a plan view of a first coil 50 of the inductor according to the second embodiment of the present invention. The first coil 50 formed in a concentric shape is provided with a wiring 51 as an outermost portion. One end of the wiring 51 is connected to the input terminal 12 and the other end is a connection portion 51a.

A wiring 52 is formed inside the wiring 51, one end of which is a connection portion 52a and the other end of which is a connection portion 52b. A wiring 53 is formed inside the wiring 52, one end of which is a connection portion 53a and the other end of which is a connection portion 53b. A wiring 54 is formed inside the wiring 53, one end of which is a connection portion 54a and the other end of which is a connection portion 54b. A wiring 55 is formed inside the wiring 54, one end of which is a connection portion 55a and the other end of which is a connection portion 55b.

Figure 5:
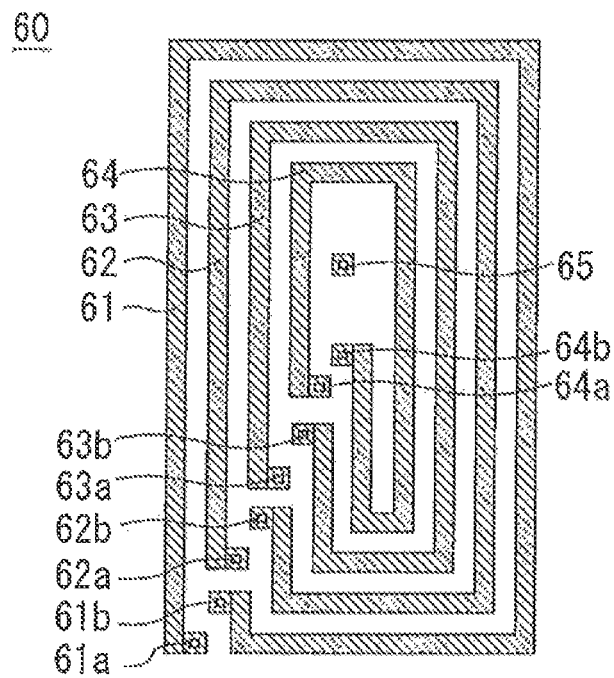
FIG. 5 is a plan view of a second coil of the inductor according to the second embodiment of the present invention.

FIG. 5 is a plan view of a second coil 60 of the inductor according to the second embodiment of the present invention. The second coil 60 formed in a concentric shape is provided with a wiring 61 as an outermost portion. One end of the wiring 61 is a connection portion 61a and the other end thereof is a connection portion 61b. A wiring 62 is formed inside the wiring 61, one end of which is a connection portion 62a and the other end of which is a connection portion 62b. A wiring 63 is formed inside the wiring 62, one end of which is a connection portion 63a and the other end of which is a connection portion 63b. A wiring 64 is formed inside the wiring 63, one end of which is a connection portion 64a and the other end of which is a connection portion 64b.

Figure 6:
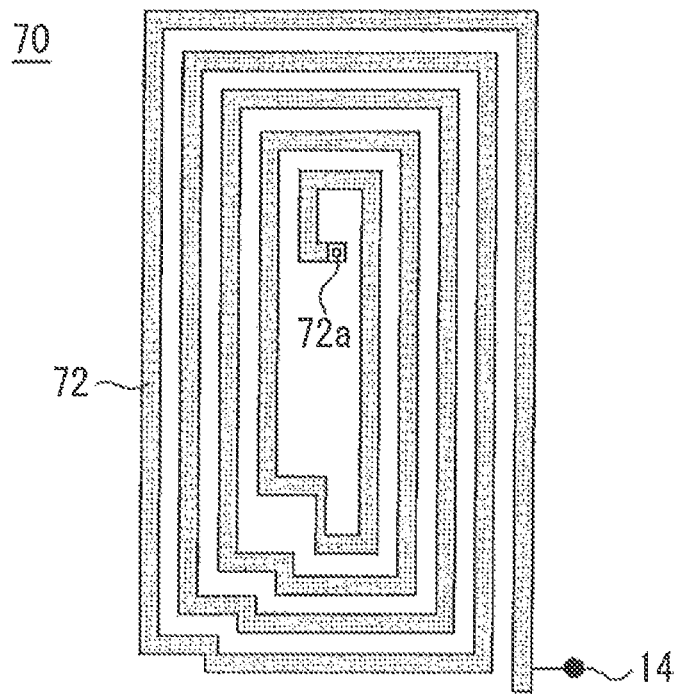
FIG. 6 is a plan view of a third coil of the inductor according to the second embodiment of the present invention.

FIG. 6 is a plan view of a third coil 70 of the inductor according to the second embodiment of the present invention. The third coil 70 formed in a spiral shape is provided with a wiring 72, one end of which is a connection portion 72a formed at a central portion of the third coil 70 and the other end of which (outermost portion) is connected to an output terminal 14.

The first coil 50 and the second coil 60 are connected so that a signal propagates through outside portions of the first coil 50 and second coil 60 first. That is, the connection portion 51a, 52a, 52b, 53a, 53b, 54a, 54b and 55a of the first coil 50 are connected to the 61a, 61b, 62a, 62b, 63a, 63b, 64a and 64b of the second coil via the connection conductors respectively. The central portion (connection portion 55b) of the first coil 50 is connected to the central portion (connection portion 72a) of the third coil 70 through the central portion connection conductor via the connection portion 65.

A signal flow of the inductor according to the second embodiment will be described. A signal inputted from the input terminal 12 first propagates through the wiring 51 and propagates through wiring 61 via the connection portion 51a and the connection portion 61a. Then, the signal propagates through the wiring 52 via the connection portion 61b and the connection portion 52a. Then, the signal propagates through the wiring 62 via the connection portion 52b and the connection portion 62a. Then, the signal propagates through the wiring 53 via the connection portion 62b and the connection portion 53a. Then, the signal propagates through the wiring 63 via the connection portion 53b and the connection portion 63a. Then, the signal propagates through the wiring 54 via the connection portion 63b and the connection portion 54a. Then, the signal propagates through the wiring 64 via the connection portion 54b and the connection portion 64a. Then, the signal propagates through the wiring 55 via the connection portion 64b and the connection portion 55a and reaches the connection portion 55b.

Then, the signal reaches the central portion (connection portion 72a) of the third coil 70 from the connection portion 55b through the central portion connection conductor via the connection portion 65. Finally, the signal propagates from the inside portion to the outside portion of the third coil 70 and reaches the output terminal 14.

Figure 7:
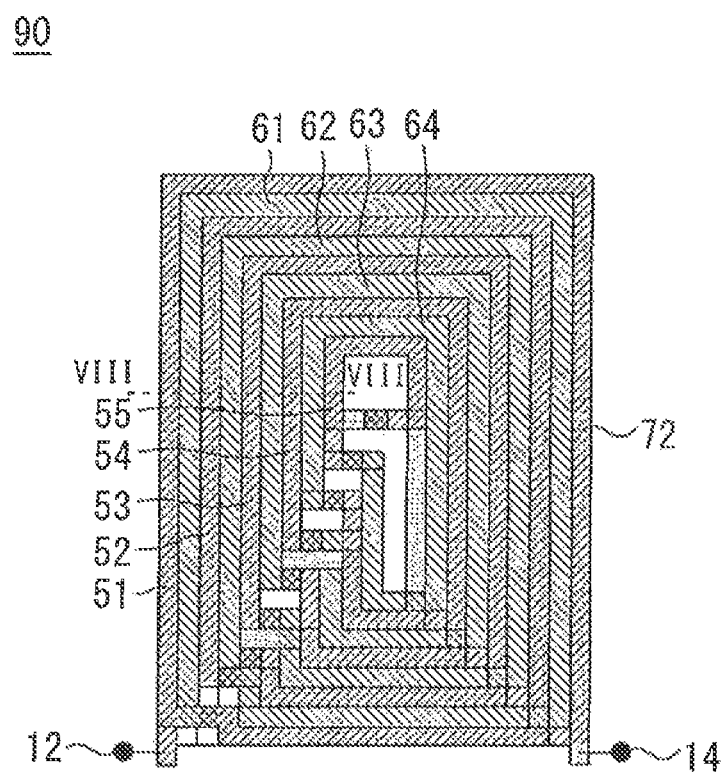
FIG. 7 is a plan view of an inductor when the first to third coils are displayed superimposed on one another.
Figure 8:
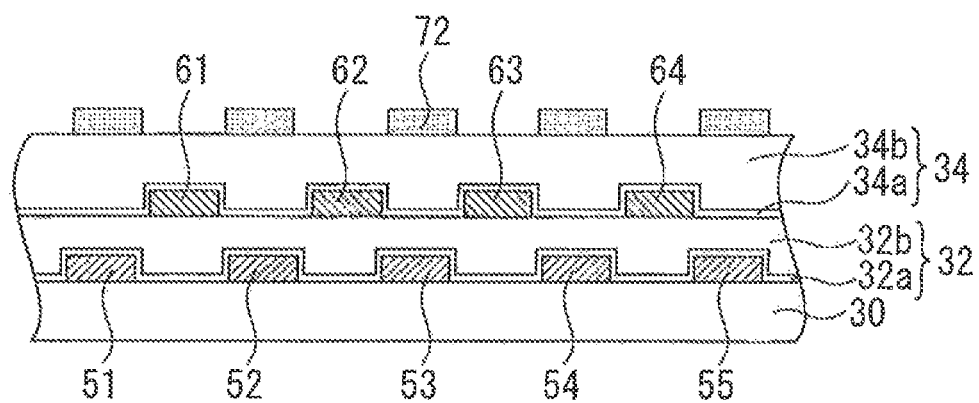
FIG. 8 is a cross-sectional view along a broken line VIII-VIII in FIG. 7.

FIG. 7 is a plan view of an inductor 90 when the first to third coils 50, 60 and 70 are displayed superimposed on one another. FIG. 8 is a cross-sectional view along a broken line VIII-VIII in FIG. 7. As shown in FIG. 8, the wirings 61, 62, 63 and 64 of the second coil 60 are formed so as to avoid positions right above the wirings 51, 52, 53, 54 and 56 of the first coil 50, and the wiring 72 of the third coil 70 is formed right above the wirings 51, 52, 53, 54 and 55.

Figure 9:
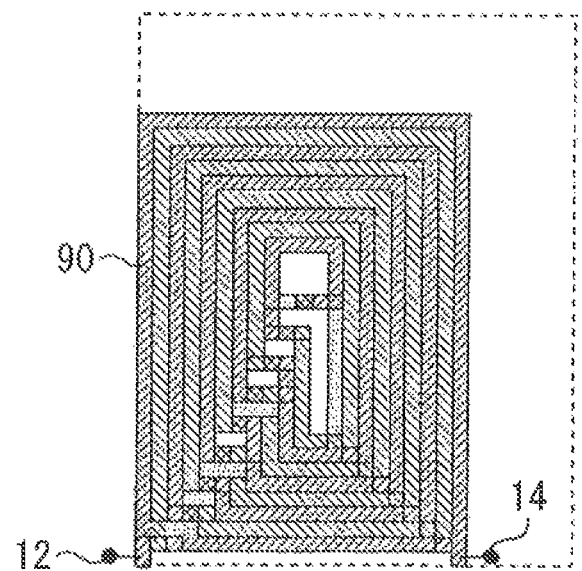
FIG. 9 is a plan view of the inductor according to the second embodiment.

FIG. 9 is a plan view of the inductor 90 according to the second embodiment. The broken line illustrates an outline of an inductor having the same number of turns as the inductor 90 in which coils are formed in two layers. When a high inductance is required, the number of turns of the inductor needs to be increased, and therefore the area of the inductor is likely to increase. It has been conventionally difficult to create an inductor in a simple configuration in which coils are formed in three layers, and therefore coils cannot help but be formed on two layers in order to increase the number of turns. For that reason, the inductor is upsized as shown by the broken line in FIG. 9.

However, the inductor 90 according to the second embodiment of the present invention adopts a configuration in which a signal propagates through outside portions of the first coil and the second coil first, and thereby constitutes an inductor having a three-layer structure connectable to terminals in a simple configuration. Therefore, a small inductor 90 can be provided as shown in FIG. 9.

Third Embodiment

Figure 10:
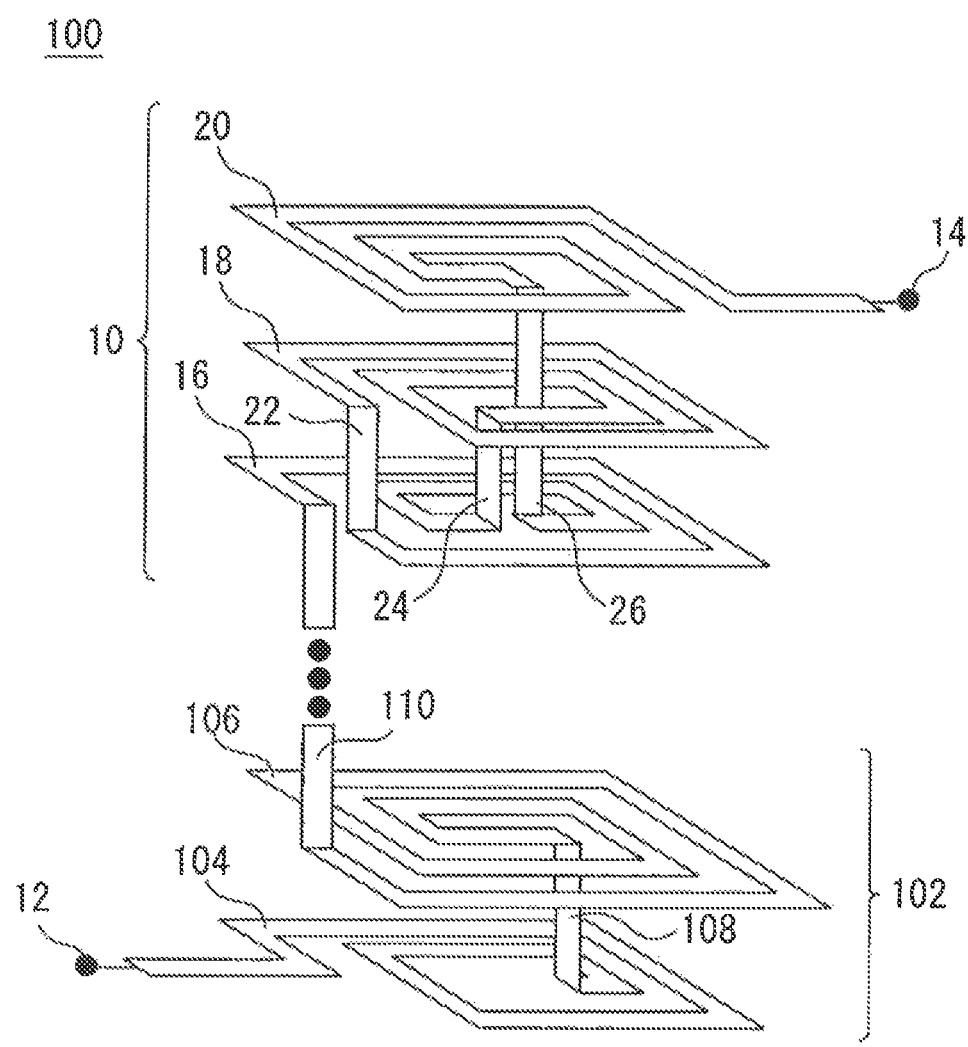
FIG. 10 is a perspective view of an inductor according to a third embodiment of the present invention.

FIG. 10 is a perspective view of an inductor 100 according to a third embodiment of the present invention. The inductor 100 corresponds to the inductor 10 of the first embodiment with a structure 102 added. A first additional coil 104 and a second additional coil 106 are formed below the first coil 16.

The first additional coil 104 has a spiral shape whose outermost portion is connected to the input terminal 12. A spiral second additional coil 106 is formed in a spiral shape above the first additional coil 104. An insulator is formed between the first additional coil 104 and the second additional coil 106. The central portion of the first additional coil 104 and the central portion of the second additional coil 106 are connected by an additional central portion connection conductor 108. The outermost portion of the first coil 16 and the outermost portion of the second additional coil 106 are electrically connected via an additional connection conductor 110.

The inductor 100 includes the additional structure 102 of a two-layer structure and the inductor 10 of a three-layer structure, and therefore has a five-layer structure as a whole. Note that part of the additional connection conductor 110 is expressed by a dotted line, which indicates that an optional number of additional structures 102 can be added. For example, when N additional structures 102 are formed, the inductor as a whole has (3+2N) layers in which coils are formed.

Note that not only the additional structure 102 but also a ring-shaped coil whose number of turns is one can be inserted in the portion shown by the dotted line. For example, when one ring-shaped coil and one additional structure 102 are formed, the inductor as a whole has six layers in which coils are formed. However, if the total number of layers in which coils are formed is an even number, all coils can be formed in a spiral shape, and so adopting the structure of the present invention would not yield much profit. For this reason, the present invention is preferably applied to an inductor in which the total number of layers in which coils are formed is an odd number equal to or greater than 3 (e.g., 5 or 7).

The inductor 100 has a greater inductance than the inductor 10 by an amount corresponding to the additional structure 102. However, the inductor 100 and the inductor 10 have the same occupation area. Therefore, the inductor 100 is suitable for an MMIC application required to achieve a great inductance with a small area. Moreover, an inductance can be optionally set by increasing or decreasing the number of additional structures 102.

Fourth Embodiment

Figure 11:
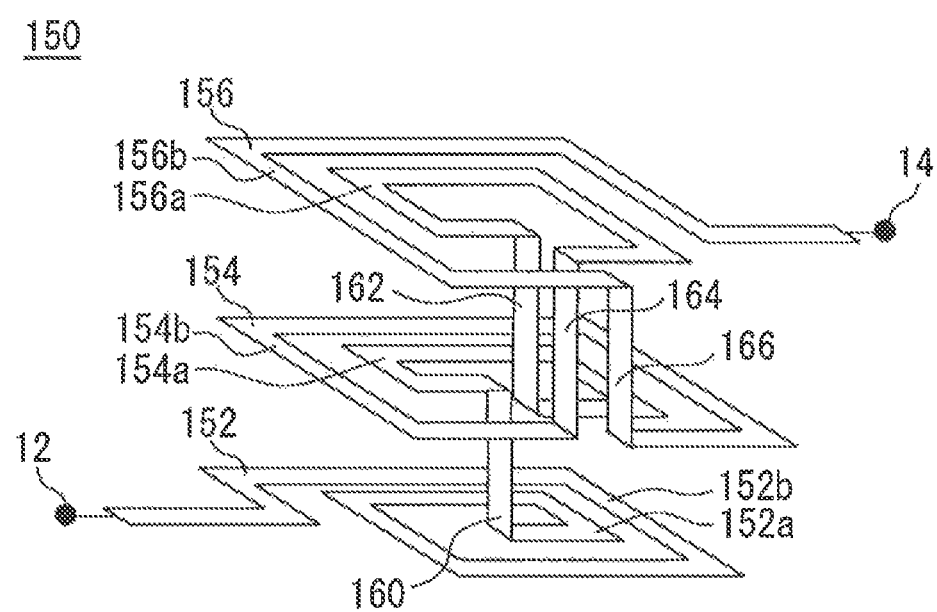
FIG. 11 is a perspective view of an inductor according to a fourth embodiment of the present invention.

FIG. 11 is a perspective view of an inductor 150 according to a fourth embodiment of the present invention. The inductor 150 is provided with a spiral first coil 152. An outermost portion of the first coil 152 is electrically connected to the input terminal 12. The first coil 152 is provided with wirings 152a and 152b.

A concentric second coil 154 is formed above the first coil 152. The second coil 154 is provided with wirings 154a and 154b. A concentric third coil 156 is formed above the second coil 154. The third coil 156 is provided with wirings 156a and 156b. The outermost portion of the third coil 156 is electrically connected to the output terminal 14.

As in the case of the first embodiment, a first insulating film is formed on the first coil 152 so as to cover the first coil 152 and a second insulating film is formed on the second coil 154 so as to cover the second coil 154. Therefore, the second coil 154 is formed on the first insulating film and the third coil 156 is formed on the second insulating film.

The central portion (wiring 152a) of the first coil 152 and the central portion (wiring 154a) of the second coil 154 are connected via a central portion connection conductor 160. The second coil 154 and the third coil 156 are connected via a plurality of connection conductors 162, 164 and 166 so that a signal propagates through inside portions of the second coil 154 and the third coil 156 first. That is, the wiring 154a which is the inside portion of the second coil 154 and the wiring 156a which is the inside portion of the third coil 156 are connected via the connection conductor 162. The wiring 156a and the wiring 154b which is the outside portion of the second coil 154 are connected via the connection conductor 164. The wiring 154b and the wiring 156b which is the outside portion of the third coil 156 are connected via the connection conductor 166.

A signal inputted from the input terminal 12 propagates through the first coil 152 first. Then, the signal propagates through the wiring 154a via the central portion connection conductor 160 and propagates through the wiring 156a via the connection conductor 162. That is, the signal propagates through inside portions of the second coil 154 and the third coil 156. Then, the signal propagates through the wiring 154b via the connection conductor 164 and propagates through the wiring 156b via the connection conductor 166, and is outputted to the output terminal 14. That is, the signal propagates through outside portions of the second coil 154 and the third coil 156.

The second coil 154 and the third coil 156 are connected via the plurality of connection conductors 162, 164 and 166 so that a signal propagates through inside portions of the second coil 154 and the third coil 156 first. This allows the signal to propagate from inside portions to outside portions of the third coil 156. Therefore, the inductor 150 can connect the input terminal 12 to the outermost portion of the first coil 152 and connect the output terminal 14 to the outermost portion of the connection third coil 156, and therefore this is a quite simple configuration without requiring any complicated configuration such as an air bridge.

The inductance of the inductor 150 can be easily changed by changing the number and layout of the plurality of connection conductors thereof. For example, the first coil 152 may be formed as a common specification and a plurality of connection conductors can be created for products having different inductances.

Instead of connecting the central portion of the first coil 152 and the central portion of the second coil 154, the central portion connection conductor 160 may connect the central portion of the first coil 152 and the central portion (wiring 156a) of the third coil 156. Other configurations may be adopted for the plurality of connection conductors 162, 164 and 166 that connect the second coil 154 and the third coil 156 at a plurality of locations as long as a signal propagates through inside portions of the second coil 154 and the third coil 156 first.

In the fourth embodiment of the present invention, the second coil 154 and the third coil 156 are formed in a concentric shape, but it is not particularly limited whether the second coil 154 and the third coil 156 are formed in a concentric shape or in a spiral shape as long as a signal propagates through inside portions of the second coil 154 and the third coil 156 first.

Fifth Embodiment

Figure 12:
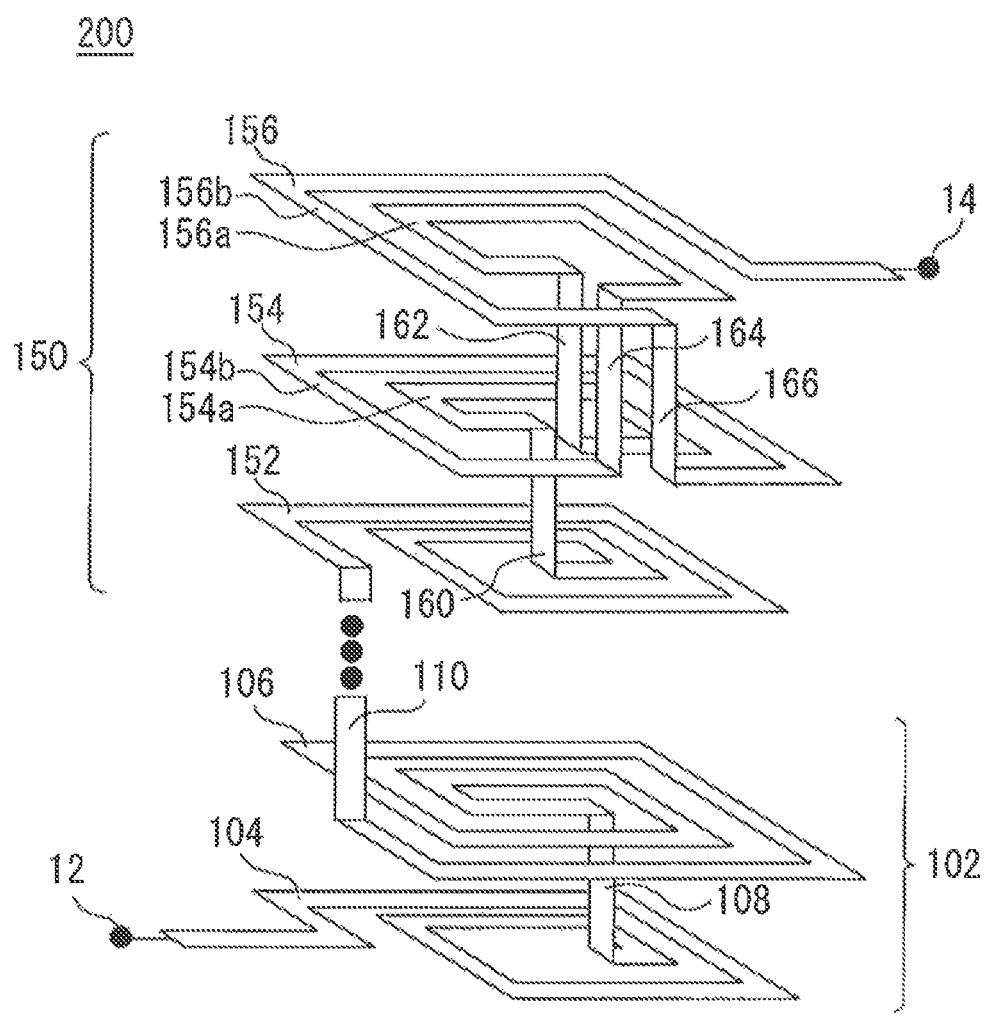
FIG. 12 is a perspective view of an inductor according to a fifth embodiment of the present invention.

FIG. 12 is a perspective view of an inductor 200 according to a fifth embodiment of the present invention. The inductor 200 corresponds to the inductor 150 of the fourth embodiment with the additional structure 102 of the third embodiment added. The inductance of the inductor 200 is greater than that of the inductor 150 by an amount corresponding to the additional structure 102. However, the inductor 150 and inductor 200 have the same occupation area. Therefore, the inductor 200 is suitable for an MMIC application required to achieve a great inductance with a small area. Moreover, an inductance can be optionally set by increasing or decreasing the number of additional structures 102.

Sixth Embodiment

Figure 13:
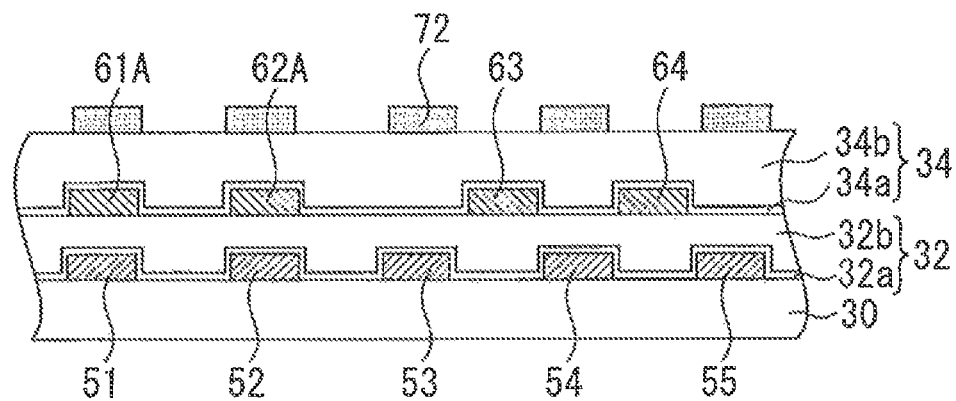
FIG. 13 is a cross-sectional view of an inductor according to the sixth embodiment of the present invention.

An inductor according to a sixth embodiment of the present invention relates to an inductor corresponding to the inductor 90 according to the second embodiment with the position of the second coil changed. FIG. 13 is a cross-sectional view of an inductor 250 according to the sixth embodiment of the present invention. A wiring 61A is located right above the wiring 51 and right below the wiring 72. A wiring 62A is located right above the wiring 52 and right below the wiring 72. That is, parts (wiring 61A, 62A) of the second coil are located right above the first coil and right below the third coil. Note that parts (wiring 61A, 62A) of the second coil are portions that extend parallel to the first coil. Therefore, the wirings 61A and 62A, and wirings 51 and 52 do not simply cross each other but extend parallel by a certain distance.

Figure 14:
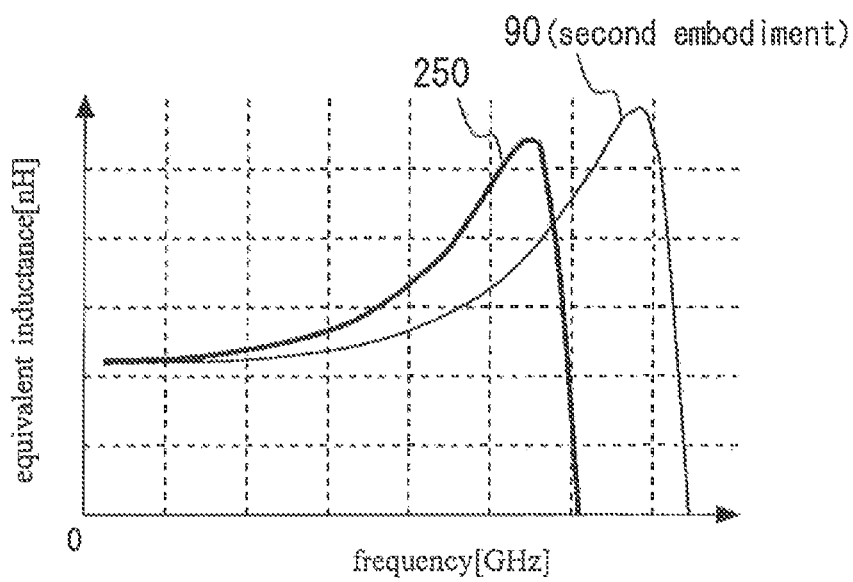
FIG. 14 is a diagram illustrating frequency characteristics of the inductor.

Configured as described above, the inductor 250 includes portions having smaller distances between wirings compared to the inductor 90 of the second embodiment. It is thereby possible to increase a coupling capacitance between coils. FIG. 14 is a diagram illustrating frequency characteristics of the inductor 250 of the sixth embodiment and the inductor 90 of the second embodiment. The cutoff frequency of the inductor 250 is shifted to a low-frequency side compared to the cutoff frequency of the inductor 90.

As in the case of the inductor 250, by causing parts of the second coil to approach the first coil and third coil more than the other parts of the second coil, it is possible to change the frequency characteristic of the inductor 250. For example, consider a case where the inductor 250 is mounted on an MMIC as a matching circuit such as an amplifier or filter circuit. In this case, characteristic fluctuations may occur due to transistor manufacturing variations, but it is possible to correct distances between wirings to prevent these characteristic fluctuations from occurring. Correction of distances between wirings can be made more easily than changing the number of turns of the inductor.

The inductor 250 employs the wirings 61A and 62A as wirings for reducing distances between wirings, but other wirings may also be used to provide parts with short distances between wirings. Note that providing the wiring of the second coil right above the first coil and right below the third coil is efficient because this makes it possible to simultaneously shift the coupling capacitance for the first coil and the coupling capacitance for the third coil.

Seventh Embodiment

Figure 15:
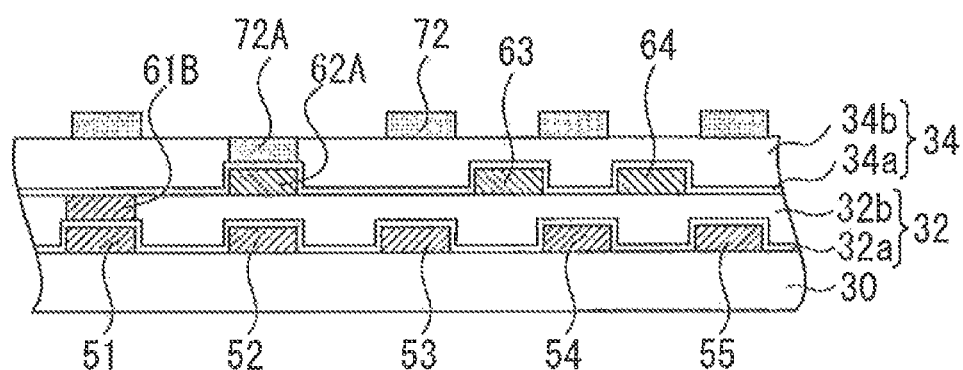
FIG. 15 is a cross-sectional view of an inductor according to the seventh embodiment of the present invention.

An inductor according to a seventh embodiment of the present invention relates to an inductor corresponding to the inductor 90 according to the second embodiment with the positions of the second coil and third coil changed. FIG. 15 is a cross-sectional view of an inductor 300 according to the seventh embodiment of the present invention. The wiring 61B contacts the wiring 51 only via the insulating film 32a. The wiring 61B is formed by perforating part of the dielectric film 32b and filling the opening. The wirings 62A, 63 and 64 contact the first coil via the insulating film 32a and the dielectric film 32b. Therefore, the vertical distance (shortest distance) between the first coil and second coil varies from place to place.

A wiring 72A of the third coil contacts the wiring 62A only via the insulating film 34a. The wiring 72A is formed by perforating part of the dielectric film 34b and filling the opening. The portion of the wiring 72 other than the wiring 72A contacts the second coil via the insulating film 34a and the dielectric film 34b. Therefore, the vertical distance (shortest distance) between the second coil and third coil varies from place to place.

Figure 16:
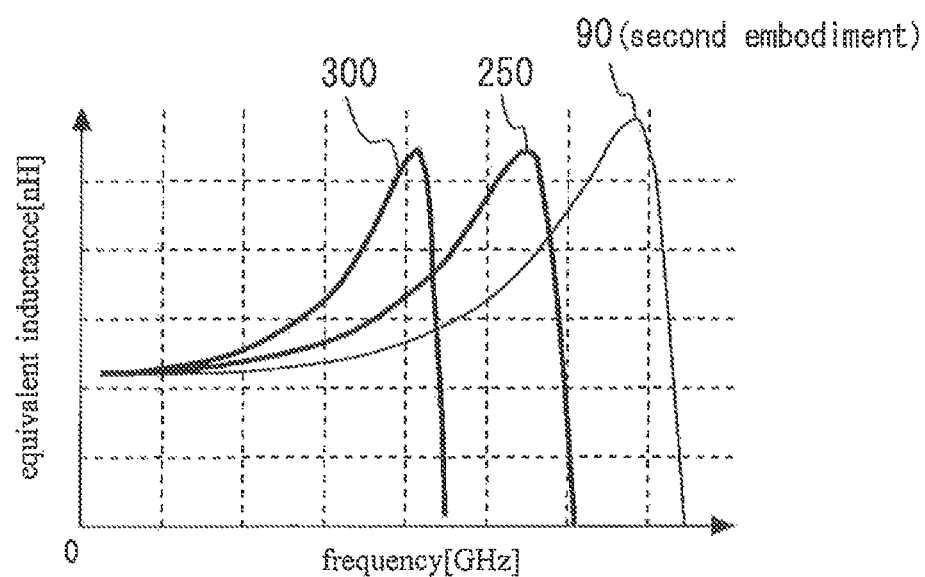
FIG. 16 is a diagram illustrating frequency characteristics of the inductor.

Thus, since the wiring 61B contacts the wiring 51 only via the insulating film 32a, it is possible to increase the coupling capacitance between the first coil and second coil. In addition, since the wiring 72A contacts the wiring 62A only via the insulating film 34a, it is possible to increase the coupling capacitance between the second coil and third coil. FIG. 16 is a diagram illustrating frequency characteristics of the inductor 300 according to the seventh embodiment, the inductor 250 of the sixth embodiment and the inductor 90 of the second embodiment. According to the inductor 300, it is possible to shift the cutoff frequency to a low-frequency side more than the inductor 250 and inductor 90.

Any one of the wiring 61B and the wiring 72A may be employed depending on the frequency characteristic to be achieved. Features of the inductors and MMIC according to the respective embodiments described so far may be combined with each other as appropriate.

According to the present invention, the connection of the coil of a layer below the top layer is adjusted to enable a signal to be inputted to the inside portion of the coil of the top layer, and it is thereby possible to provide an inductor and an MMIC using the inductor in a simple configuration to allow a connection with terminals.

Obviously many modifications and variations of the present invention are possible in the light of the above teachings. It is therefore to be understood that within the scope of the appended claims the invention may be practiced otherwise than as specifically described.

What is claimed is:
1. An inductor comprising:
a first coil;
an input terminal electrically connected to an outermost portion of the first coil;
a first insulating film on the first coil and covering the first coil;
a second coil on the first insulating film;

a second insulating film on the second coil and covering the second coil;
a third coil on the second insulating film;
a plurality of connection conductors that connect to the first coil and to the second coil, at a plurality of locations, so that an input signal input through the input terminal propagates through outside portions of the first coil and of the second coil before propagating through inside portions of the first coil and of the second coil;
a central portion connection conductor that connects a central portion of the first coil or a central portion of the second coil to a central portion of the third coil; and
an output terminal electrically connected to an outermost portion of the third coil, wherein
the input terminal is electrically connected to the outermost portion of the first coil so that the input signal propagates through the outside portions of the first coil and of the second coil before propagating through the inside portion of the first coil, wherein the outside portion of the first coil is located between the input terminal and the inside portion of the first coil, and
the output terminal is electrically connected to the outside portion of the third coil so that the input signal propagates through the first coil and the second coil before propagating through an inside portion of the third coil, wherein the outside portion of the third coil is located between the output terminal and the inside portion of the third coil.

2. An inductor comprising:
a first coil;
an input terminal electrically connected to an outermost portion of the first coil;
a first insulating film on the first coil and covering the first coil;
a second coil on the first insulating film;
a second insulating film on the second coil and covering the second coil;
a third coil on the second insulating film;
a central portion connection conductor that connects a central portion of the first coil to a central portion of the second coil or to a central portion of the third coil;
a plurality of connection conductors that connect to the second coil and to the third coil, at a plurality of locations, so that an input signal input through the input terminal propagates through inside portions of the second coil and of the third coil before propagating through outside portions of the second coil and of the third coil; and
an output terminal electrically connected to an outermost portion of the third coil, wherein
the input terminal is electrically connected to the outermost portion of the first coil so that the input signal propagates through the inside portions of the first coil and of the second coil before propagating through the outside portion of the second coil, wherein the outside portion of the first coil is located between the input terminal and the inside portion of the first coil, and
the output terminal is electrically connected to the outermost portion of the third coil so that the input signal propagates through the first coil and the second coil before propagating through an inside portion of the third coil, wherein the outside portion of the third coil is located between the output terminal and the inside portion of the third coil.

3. The inductor according to claim 1, further comprising, at a location on an opposite side of the first coil from the second coil:
a first additional coil connected to the input terminal at an outside portion of the first additional coil;
a second additional coil located between the first additional coil and the first coil;
an additional central portion connection conductor that connects a central portion of the first additional coil to a central portion of the second additional coil; and
an additional connection conductor that connects the outside portion of the first coil to the outside portion of the second additional coil.

4. The inductor according to claim 1, wherein
the second coil is not positioned directly opposite the first coil, and
the third coil is located directly opposite the first coil, when viewed transverse to the first, second, and third coils.

5. The inductor according to claim 1, wherein
part of the second coil is positioned directly opposite the first coil, and directly opposite the third coil, when viewed transverse to the first, second, and third coils, and
part of the second coil extends parallel to the first coil.

6. The inductor according to claim 1, wherein separation, along directions transverse to the first and second coils, between wirings of the first coil and wirings of the second coil, varies from place to place across the inductor.

7. The inductor according to claim 1, wherein separation, along directions transverse to the first and third coils, between wirings of the second coil and wirings of the third coil, varies from place to place across the inductor.

8. An MMIC comprising:
a substrate;
a transistor on the substrate;
a resistance element on the substrate;
a capacitor on the substrate; and
an inductor on the substrate, wherein the inductor comprises
a first coil,
an input terminal electrically connected to an outermost portion of the first coil,
a first insulating film on the first coil and covering the first coil,
a second coil on the first insulating film,
a second insulating film on the second coil and covering the second coil,
a third coil on the second insulating film,
a central portion connection conductor that connects a central portion of the first coil or a central portion of the second coil to a central portion of the third coil,
a plurality of connection conductors that connect to the first coil and to the second coil, at a plurality of locations, so that an input signal input through the input terminal propagates through outside portions of the first coil and of the second coil before propagating through inside portions of the first coil and the second coil, and
an output terminal electrically connected to an outermost portion of the third coil, wherein
the input terminal is electrically connected to the outermost portion of the first coil so that the input signal propagates through the outermost portions of the first coil and of the second coil before propagating through the inside portion of the first coil, wherein the outermost portion of the first coil is located between the input terminal and the inside portion of the first coil, and the output terminal is electrically connected to the outermost portion of the third coil so that the input signal propagates through the first coil and the second coil before propagating through an inside portion of the third coil, wherein the outside portion of the third coil is located between the output terminal and the inside portion of the third coil.

9. An MMIC comprising:
a substrate;
a transistor on the substrate;
a resistance element on the substrate;
a capacitor on the substrate; and
an inductor on the substrate, wherein the inductor comprises
a first coil,
an input terminal electrically connected to an outermost portion of the first coil,
a first insulating film on the first coil and covering the first coil,
a second coil on the first insulating film,
a second insulating film on the second coil and covering the second coil,
a third coil on the second insulating film,
a central portion connection conductor that connects a central portion of the first coil to a central portion of the second coil or a central portion of the third coil,
a plurality of connection conductors that connect to the second coil and to the third coil, at a plurality of locations, so that an input signal input through the input terminal propagates through inside portions of the second coil and of the third coil before propagating through outside portions of the second coil and of the third coil, and
an output terminal electrically connected to an outermost portion of the third coil, wherein
the input terminal is electrically connected to the outermost portion of the first coil so that the input signal propagates through the inside portions of the first coil and of the second coil before propagating through the outside portion of the second coil, wherein the outside portion of the first coil is located between the input terminal and the inside portion of the first coil, and the output terminal is electrically connected to the outermost portion of the third coil so that the input signal propagates through the first coil and the second coil before propagating through an inside portion of the third coil, wherein the outside portion of the third coil is located between the output terminal and the inside portion of the third coil.

10. The inductor according to claim 2, further comprising, at a location on an opposite side of the first coil from the second coil:
a first additional coil connected to the input terminal at an outside portion of the first additional coil;
a second additional coil located between the first additional coil and the first coil;
an additional central portion connection conductor that connects a central portion of the first additional coil to a central portion of the second additional coil; and
an additional connection conductor that connects the outside portion of the first coil to the outside portion of the second additional coil.

11. The inductor according to claim 2, wherein
the second coil is not positioned directly opposite the first coil, and
the third coil is located directly opposite the first coil, when viewed transverse to the first, second, and third coils.

12. The inductor according to claim 2, wherein
part of the second coil is positioned directly opposite the first coil, and directly opposite the third coil, when viewed transverse to the first and third coils, and
part of the second coil extends parallel to the first coil.

13. The inductor according to claim 2, wherein separation, along directions transverse to the first and second coils, between wirings of the first coil and wirings of the second coil, varies from place to place across the inductor.

14. The inductor according to claim 2, wherein separation, along directions transverse to the first and third coils, between wirings of the second coil and wirings of the third coil, varies from place to place across the inductor.

* * * * *